United States Patent

Takahashi

Patent Number: 5,607,515
Date of Patent: Mar. 4, 1997

[54] METHOD OF CLEANING CVD APPARATUS

[75] Inventor: Hironari Takahashi, Itami, Japan

[73] Assignee: Mitsubishi Denki Kabushiki Kaisha, Tokyo, Japan

[21] Appl. No.: 547,924

[22] Filed: Oct. 25, 1995

Related U.S. Application Data

[62] Division of Ser. No. 356,502, Dec. 15, 1994, Pat. No. 5,517,943.

[30] Foreign Application Priority Data

Dec. 16, 1993 [JP] Japan .................. 5-316567

[51] Int. Cl.$^6$ .................................................. B08B 7/04
[52] U.S. Cl. .................................... 134/18; 134/22.1
[58] Field of Search ........................... 134/1, 1.3, 22.1, 134/21, 22.11, 18, 22.12

[56] References Cited

U.S. PATENT DOCUMENTS

| | | | |
|---|---|---|---|
| 5,109,562 | 5/1992 | Albrecht | 15/56 |
| 5,254,176 | 10/1993 | Ibuka et al. | 134/2 |
| 5,271,264 | 12/1993 | Chanayem | 73/28.01 |
| 5,294,262 | 5/1994 | Nishimura | 134/22.1 |

Primary Examiner—Robert J. Warden
Assistant Examiner—Alexander Markoff
Attorney, Agent, or Firm—Leydig, Voit & Mayer

[57] ABSTRACT

A vacuum CVD apparatus including a reaction chamber into which a fluorine-containing compound gas and a carrier gas are introduced for cleaning. The fluorine-containing compound gas reacts with the matter deposited on the inner surface of the reaction chamber to gasify and remove the matter, preventing contamination of a semiconductor wafer later placed in the reaction chamber. Thus, it is possible to achieve high reliability of VSLIs produced in the reaction chamber.

1 Claim, 4 Drawing Sheets

METHOD OF CLEANING CVD APPARATUS

This disclosure is a division of U.S. patent application Ser. No. 08/356,502, filed Dec. 15, 1994, now U.S. Pat. No. 5,517,943.

BACKGROUND OF THE INVENTION

1. Field of the Invention

The present invention relates to a vacuum chemical vapor deposition (referred to as CVD hereinafter) apparatus and a method of cleaning the CVD appartus. More particularly, the present invention is concerned with a vacuum CVD apparatus used for forming by deposition a polycrystalline silicon film in semiconductor production process and also to a method for cleaning the vacuum CVD apparatus.

2. Description of the Related Art

FIG. 4 schematically shows the construction of a conventional horizontal-type CVD apparatus. Referring to this Figure, a plurality of semiconductor wafers, on each of which a polycrystalline silicon film is to be formed, are mounted on a quartz boat 2 which is received in a reaction chamber defined by, for example, a quartz tube 3. Vacuum flanges 4a, 4b are provided on both ends of the quartz tube 3. The quartz tube 3 is surrounded by a heater 5 for controlling the reaction temperature.

Deposition of the polycrystalline film is conducted by using, for example, $SiH_4$ gas, together with $PH_3$ gas which is used to dope the polycrystalline silicon film with phosphorus for the purpose of controlling the resistivity of the polycrystalline film. At the same time a carrier gas such as $N_2$ gas is used. These gases are supplied, respectively, from an $SiH_4$ gas source 6, a $PH_3$ gas source 7 and an $N_2$ gas source 8, via flow-rate controlling mass-flow controllers 9, 10 and 11 and valves 12, 13 and 14, such as pneumatically operated valves.

Each of these gases is supplied to the quartz tube 3 through either one of the vacuum flanges 4a and 4b on both sides of the quartz tube 3, by the actions of gas introduction valves 15a, 15b such as pneumatically operated valves which change the direction of introduction of the gas in a manner like a flip-flop. The gas after use in the quartz tube 3, is discharged therefrom by a vacuum pump, e.g., a dry pump 19, via one of gas discharge valves 16a, 16b which are provided in a vacuum pipe 16A and operatively associated with gas introduction valves 15a, 15b, located beyond vacuum main valve 17 and a sub-valve 18.

The term "manner like a flip-flop" is intended to mean such a switching operation that the following first and second phases of operation are switched at a predetermined period. In the first phase, the gas introduction valve 15a and the gas discharge valve 16b are opened to allow the gas to be introduced into the quartz tube 3 through the vacuum flange 4a and discharged through the vacuum flange 4b, whereas, in the second phase, the gas introduction valve 15a and the gas discharge valve 16b are closed and, instead, the gas introduction valve 15b and the gas discharge valve 16a are opened to allow the gas to be introduced into the quartz tube 3 through the vacuum flange 4b and discharged through the vacuum flange 4a.

In the conventional horizontal-type vacuum CVD apparatus, having the described construction, phosphorus-doped polycrystalline silicon film is deposited by using $SiH_4$ gas, $PH_3$ gas and $N_2$ gas, by the flip-flop type gas introduction-discharge switching system. The $PH_3$ gas is diluted by, for example, Ar gas at a $PH_3$/Ar ratio of 1/99, the Ar gas being supplied from the $PH_3$ gas source 7.

The deposition of the phosphorus-doped polycrystalline silicon film on the silicon wafer 1 is conducted as follows. The quartz boat 2 carrying a plurality of silicon wafers 1 is set in the quartz tube 3 under atmospheric pressure. Then, the vacuum sub-valve 18 is opened and the dry pump 19 is started to gently reduce the pressure inside the quartz tube 3 down to 20 Torr or so. The pressure reduction has to be done gently in order to prevent evolving of particles which reside on the quartz tube 3, thereby preventing defects in patterns formed on the silicon wafers which may otherwise be caused due to the deposition of such particles.

When the pressure inside the quartz tube 3 has come down to below 20 Torr, the vacuum discharging main valve 17 is opened to further reduce the pressure down to $10^{-3}$ Torr. When this reduced pressure is reached, the $SiH_4$ gas, $PH_3$ gas and the $N_2$ gas are introduced into the quartz tube 3 through the gas introduction pipe 15A, from the $SiH_4$ gas supply source 6, $PH_3$ gas supply source 7 and the $N_2$ gas supply source 8. The flow rates of the gases are controlled by opening the valves 12, 13 and 14 and controlling the mass-flow controllers 9, 10 and 11, such that, for example, the $SiH_4$ gas supply rate is 800 cc/minute (volume under standard conditions (SCCM), expressed in terms of cc hereinafter), the $PH_3$ gas, supply rate is 150 cc/minute and the $N_2$ gas supply rate is 300 cc/minute. The flip-flop-type method described above is carried out such that, in the first phase, the gas introduction valve 15a is opened while the gas introduction valve 15b is closed so that the gas is introduced through the gas introduction valve 15a, and the gas discharge valve 16b is opened while the gas discharge valve 16a is closed so that the gas is discharged through the gas discharge valve 16b. Deposition is performed while the pressure inside the quartz tube 3 is maintained at a reduced pressure of 0.6 Torr. Meanwhile, the quartz tube 3 is held at a temperature of about 590° C. by the operation of the heater 5.

The deposition is continued on the silicon wafers for a certain time, e.g., 1 to 2 hours, thereafter the supply of the gases is terminated. Then, the gas introduction valve 15b is opened while the gas introduction valve 15a is closed, and the gas discharge valve 16a is opened while the gas discharge valve 16b is closed, so that the deposition is commenced again by introducing the gases through the gas introduction valve 15b and discharging the same through the gas discharge valve 16a. Thus, the deposition is conducted by alternately using the first and second phases like a flip-flop. This flip-flop type operation is necessary for the purpose of eliminating problems such as variation in the film thickness according to the position of the silicon wafers 1 on the quartz boat 2, as well as lack of uniformity in the film thickness and concentration of P as the dopant in each of the silicon wafers 1, which otherwise is caused when the deposition is continued under unidirectional supply of the gases.

The known horizontal vacuum CVD apparatus suffers from the following problems. A first problem resides in that, since the quartz tube 3 is heated to a high temperature, SiH4 gas is decomposed, with the result that a silicon oxide film, silicon and so forth are deposited on the inner surface of the quartz tube 3. In particular, when the introduction and discharge of the gases are conducted in a flip-flop-like manner as described, silicon oxide film fractions and silicon in the form of micronized particles are blown when the direction of flow of the gases is switched. The blown particles then fall onto the surfaces of the silicon wafers. Such particles undesirably deteriorate reliability of LSIs as the products of the process. In view of the current demand for larger scale of integration of VLSIs, contamination with such particles is becoming a serious problem. Thus, it is a matter of great importance to reduce particles which are undesirably deposited on the silicon wafers 1 in the course of deposition of semiconductor silicon films.

Conventionally, contaminants deposited on the inner surfaces of the quartz tube are removed by, for example, rinsing with fluoro-nitric acid after disconnecting the quartz tube 3 from the piping. This essentially requires suspension of operation of the horizontal CVD apparatus, resulting not only in a reduction of the rate of operation of the apparatus but also in the necessity of laborious cleaning work.

SUMMARY OF THE INVENTION

Accordingly, an object of the present invention is to provide a vacuum CVD apparatus, as well as method of cleaning the same, which allows cleaning for each batch of semiconductor film deposition without requiring the part to be cleaned, e.g., the quartz tube, to be disconnected from the system and which affords adequate control of the contaminant particles, thereby overcoming the above-described problems of the known arts.

To this end, according to one aspect of the present invention, there is provided a vacuum CVD apparatus comprising: a reaction chamber for accommodating a plurality of semiconductor wafers in vertical or horizontal posture; a reaction gas source for supplying a reaction gas into the reaction chamber; a carrier gas source for supplying a carrier gas into the reaction chamber; a fluorine-containing compound gas source for supplying a fluorine-containing compound gas into the reaction chamber; a piping arrangement through which both ends of the reaction chamber are connected to the reaction gas source, the carrier gas source and the fluorine-containing compound gas source; gas introduction valves provided in the piping arrangement; vacuum pipes connected to both ends of the reaction chamber; gas discharge valves provided in the vacuum pipe and operatively associated with the gas introduction valves so as to evacuate the reaction chamber while switching the paths of the gases in a manner like a flip-flop; and vacuum means connected to the vacuum pipe.

According to another aspect of the invention, there is provided a method of cleaning a vacuum CVD apparatus comprising: providing a reaction chamber accommodating a plurality of semiconductor wafers in a vertical or horizontal posture; heating the reaction chamber up to a predetermined temperature and maintaining a predetermined level of vacuum in the reaction chamber; and introducing and discharging a fluorine-containing compound gas and a carrier gas into and out of the reaction chamber while switching the paths of the gases in a manner like a flip-flop, thereby removing contaminant matters produced through reaction and deposition in the reaction chamber.

DESCRIPTION OF THE PREFERRED EMBODIMENTS

The invention will be fully understood from the following description of the preferred embodiments.

First Embodiment

Figure 1:
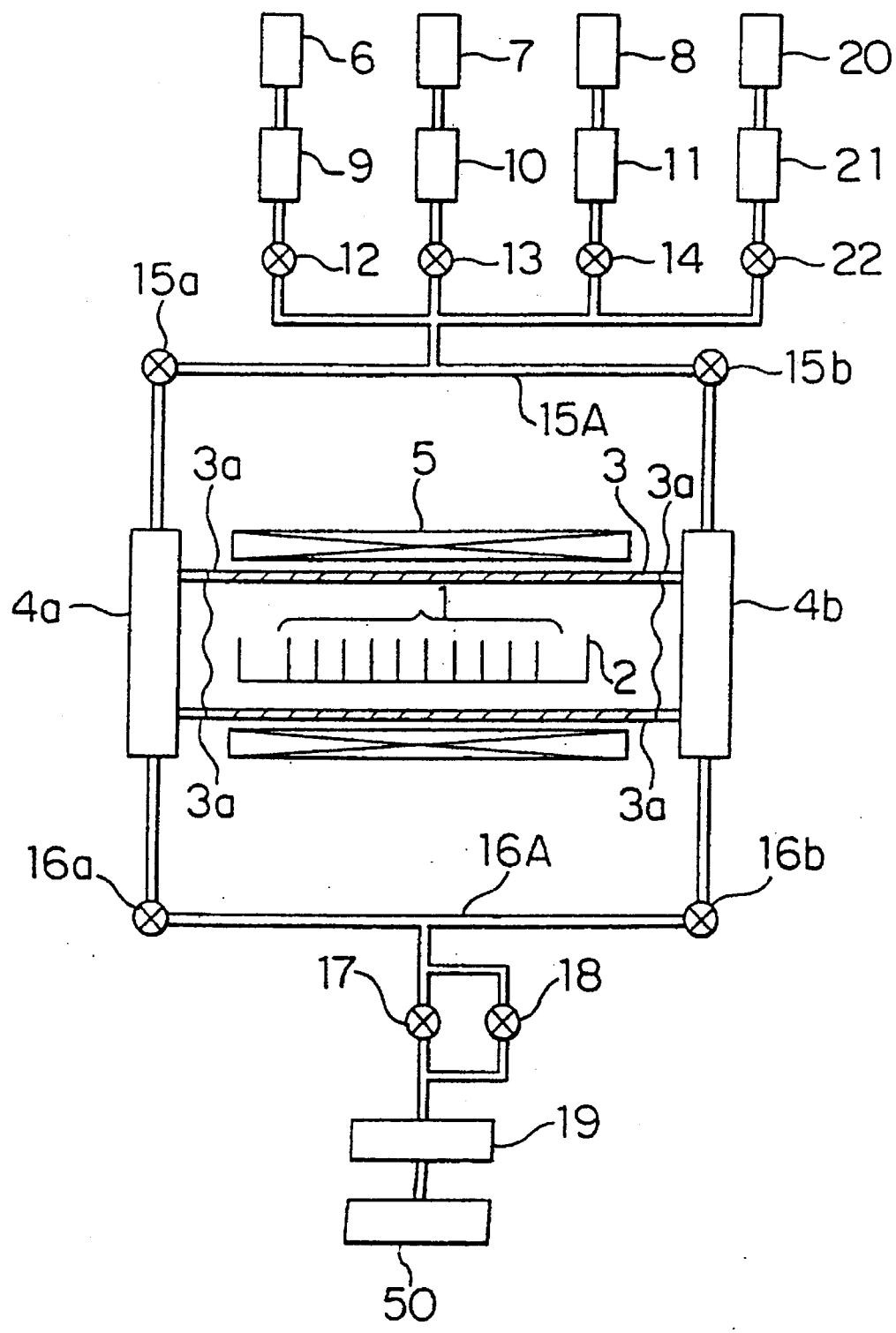
FIG. 1 is a schematic illustration of a horizontal vacuum CVD apparatus as a first embodiment of the present invention.
Figure 4:
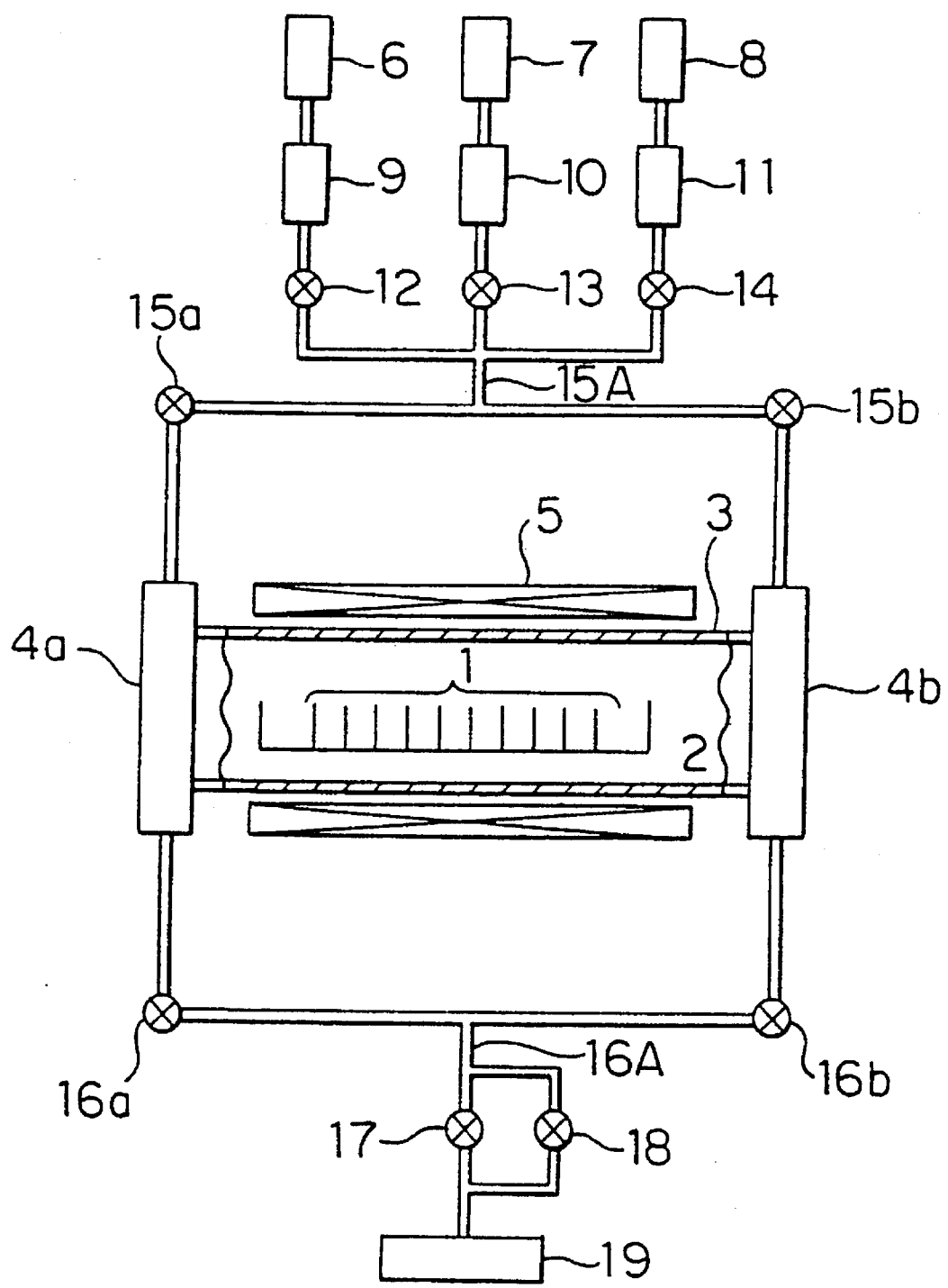
FIG. 4 is a schematic illustration of a known horizontal vacuum CVD apparatus.

FIG. 1 schematically shows the construction of a horizontal vacuum CVD apparatus as a first embodiment of the present invention. In this Figure, the same reference numerals as those appearing in FIG. 4 showing the known art are used to denote the parts of components of the embodiment which are the same as or corresponding to those in the known art.

Referring to FIG. 1, a horizontal vacuum CVD apparatus has a reaction chamber which is formed of a quartz tube 3 and vacuum flanges 4a, 4b provided on both ends of the quartz tube 3. A quartz boat 2 carrying plurality of silicon wafers 1 is disposed inside the quartz tube 3. Although not exclusive, $SiH_4$ gas and $PH_3$ gases are used as the reaction gases for forming a polycrystalline silicon film on each silicon wafer 1.

These gases are supplied from the $SiH_4$ gas source 6 and a $PH_3$ gas source 7, respectively. The apparatus further has a source of a cleaning gas for removing any contaminant deposition on the inner surface of the quartz tube 3. Although not exclusive, $ClF_3$ gas is used as the cleaning gas in this embodiment. The source of the $ClF_3$ gas is designated at numeral 20. A flow-rate controlling mass-flow controller 21 and a valve 22, e.g., a pneumatically operated valve, is disposed between the $ClF_3$ gas source 20 and the gas introduction pipe 15A.

Branches of a vacuum pipe 16A are connected to the vacuum flanges 4a and 4b which are provided on both sides of the quartz tube 3. Vacuum valves 16a and 16b provided in these branches of the pipe 16A are operatively associated with the gas introduction valves 15a, 15b and adapted to open and close in the flip-flop-like manner. The vacuum pipe 16A is connected to the dry pump 19 as vacuum means, via a vacuum discharging main valve 17 and a sub-valve 18 which are connected in parallel with each other. A noxious gas collecting device 50 for collecting noxious gases such as $ClF_3$ gas is disposed downstream of the dry pump 19.

A description will now be given of a process for forming a phosphorus-doped polycrystalline silicon film by using the above-described horizontal vacuum CVD apparatus. The process begins with placement of a quartz boat 2 carrying a plurality of silicon wafers 1 in the quartz tube 3 under atmospheric pressure. Then, the vacuum suction sub-valve 18 is opened, while the dry pump 19 is started, so that the pressure inside the quartz tube 3 is slowly reduced to 20 Torr. This pressure reduction has to be doe slowly, because a drastic pressure reduction may cause particles inside the quartz tube 3 to be blown up and fall onto the silicon wafers so as to cause defects in the patterns formed on the silicon wafers.

When the pressure inside the quartz tube 3 has come down to below 20 Torr, the vacuum main valve 17 is opened to further reduce the pressure down to $10^{-3}$ Torr. When this pressure is reached, supply of the gases is commenced so that $SiH_4$ gas, $PH_3$ gas and $N_2$ gas are introduced into the quartz tube 3 through the gas introduction pipe 15A, from the $SiH_4$ gas source 6, $PH_3$ gas source 7 and the $N_2$ gas source 8, respectively. The flow rates of the gases are controlled, as a result of opening of the valves 12, 13 and 14, by the mass-flow controllers 9, 10 and 11, such that the $SiH_4$ gas, $PH_3$ gas and the $N_2$ gas are supplied at rates of 800 cc/minute, 150 cc/minute and 300 cc/minute, respectively. In the first phase of the film deposition, the gas introduction valve 15a is opened while the gas introduction valve 15b is closed and, at the same time, the gas discharge valve 16b is opened while the gas discharge valve 16a is closed, so that the gases are introduced through the gas introduction valve 15a and discharged through the gas discharge valve 16b. During the film deposition, the pressure inside the quartz tube 3 is maintained at a level of 0.6 Torr. The quartz tube 3 temperature is heated to and maintained at about 590° C. by the operation of the heater 5.

The first phase of the film deposition for forming the polycrystalline silicon film on the silicon wafer is continued for a predetermined time; e.g., 1 to 2 hours, thereafter the supply of the gases such as $SiH_4$ gas is terminated. Then, the paths of introduction and discharge of the gases is switched in the flip-flop-like manner: namely, the gas introduction valve 15b is opened while the gas introduction valve 15a is closed, and the gas discharge valve 16a is opened while the gas discharge valve 16b is closed, so that the second phase of the deposition of the polycrystalline silicon film is commenced.

During the formation of the phosphorus-doped polycrystalline silicon film conducted in the described manner, matter mainly composed of Si or $SiO_2$ products of reaction in the vapor phase are deposited in a region of the system including low-temperature regions 3a near the ends of the quartz tube 3 and the regions between the vacuum flanges 4a, 4b and the gas discharge valves 16a, 16b. The deposited matter tends to come off during the forming of a phosphorus-doped polycrystalline silicon film on the silicon wafers 1 or when the silicon wafers 1 are brought into and out of the quartz tube 3. The matter coming off is fractioned into particles which undesirably is deposited on the surfaces of the silicon wafers 1, thus causing undesirable effect on the product. It is therefore necessary to remove such matter deposited on the above-mentioned regions when the amount of deposition has grown to a certain degree.

A cleaning operation is conducted to remove such depositing matters, in accordance with the following procedure. After restoring atmospheric pressure inside the quartz tube 3, the silicon wafers 1 after the formation of the polycrystalline silicon films are taken off the quartz boat 2 and the quartz boat 2 alone is returned to the quartz tube 3. Subsequently, a vacuum sub-valve 18 is opened so as to reduce the pressure inside the quartz tube 3 down to 20 Torr by the action of the dry pump 19. When the pressure inside the quartz tube 3 has come down to below 20 Torr, the vacuum main valve 17 is opened and pumping is further continued to reduce the pressure down to $10^{-3}$ Torr. Subsequently, the gas introduction valve 15a, as well as valves 14 and 22, are opened, so that the $ClF_3$ gas and $N_2$ gas are introduced into the quartz tube 3 at rates of 800 cc/minute and 300 cc/minute, under the control of the mass-flow controllers 11 and 12. At the same time, the dry pump 19 is continuously operated so as to maintain a reduced pressure which preferably ranges between 0.5 and 2 Torr, and is 1.0 Torr, more preferably. This reduced pressure enables the $ClF_3$ gas to sufficiently fill minute gaps such as those under the quartz boat 2, thus enabling sufficient cleaning. During this operation, the gas introduction valve 15b and the gas discharge valve 16a are kept closed, so that the vacuum exhaust is conducted through the discharge valve 16b.

Preferably, the $ClF_3$ gas is supplied at a rate of 500 to 3000 cc/minute, while the $N_2$ gas is supplied preferably at a rate of 100 to 1000 cc/minute. The gas supply rate has to be 500 cc/minute at the smallest, in order that appreciable cleaning is achieved, while the supply of the gases at a rate exceeding 3000 cc/minute will allow considerable part of the gases to be discharged without contributing to the cleaning, resulting in wasteful use of the gases. In order to enhance the etching rate, the quartz tube 3 is heated to a high temperature ranging between 580° C. and 620° C. At that elevated temperature of the quartz tube, the etching rate is about 4000 Å/minute in a phosphorus-doped polycrystalline silicon film.

The above-described cleaning operation is conducted for a suitable period, e.g., 10 minutes or so. Then, the gas introduction valves, as well as the gas discharge valves, are switched in the flip-flop-like manner: namely, the gas introduction valve 15a and the gas discharge valve 16b are closed while the gas introduction valve 15b and the gas discharge valve 16a are opened. The cleaning operation is then conducted under the same conditions as those described above, for a period of about 10 minutes. The cleaning time may be extended or shortened in accordance with factors such as the amounts of deposited matter and cleaning conditions, although the cleaning period of 10 minutes is specifically mentioned in the foregoing description. It is, however, preferred that the cleaning of the quartz tube 3 with the gases flowing in one direction and the cleaning of the same with the gases flowing in the other directions are executed over the same period of time.

The cleaning operation with the gases supplied under flip-flop-like switching of the gas supply and discharge paths makes it possible to thoroughly and quickly clean the entire quartz tube 3. In addition, since the cleaning is possible without disconnecting the quartz tube 3 from the horizontal vacuum CVD apparatus, it is possible to avoid a reduction in the rate of operation of the apparatus which otherwise may be caused due to suspension of operation of the apparatus. Furthermore, it is possible to conduct the cleaning for each batch of the semiconductor production. By conducting the cleaning each time the deposition of the phosphorus-doped polycrystalline silicon film is completed, it is possible to start each cycle of the film formation in a condition that is substantially free of deposited matter. Consequently, adequate control is effected to minimize the particles, thus contributing to improvement in the reliability of the product VLSIs.

The film forming operation and cleaning operation as described were carried out on a 6-inch silicon wafer 1, and the number of particles greater than 0.3 m remaining on the silicon wafer was measured. The number of the particles was 80 when cleaning was not conducted, whereas, after the cleaning conducted following the film forming operation, the number of particles was as small as 10, thus demonstrating the effectiveness of the cleaning method of the present invention.

Second Embodiment

Figure 2:
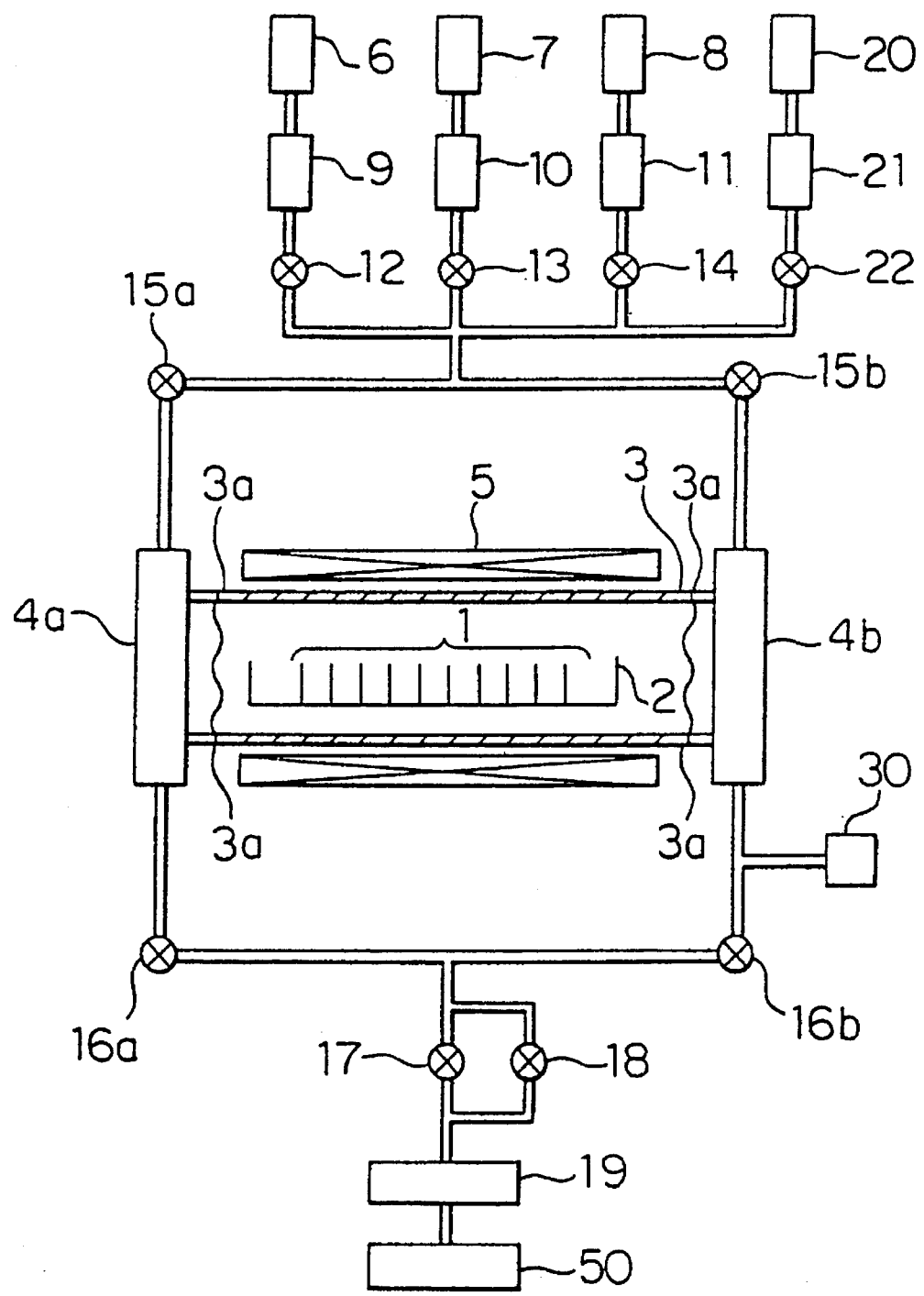
FIG. 2 is a schematic illustration of a horizontal vacuum CVD apparatus as a second embodiment of the present invention.

FIG. 2 is a schematic illustration of a horizontal vacuum CVD apparatus as a second embodiment of the present invention. Referring to this Figure, the CVD apparatus of the second embodiment has a dust counter 30 which is connected in the vacuum pipe 16A and which detects particles in the quartz tube 3. The dust counter 30 may be a known one such as a counter available from Rion Company under the trade name of "KS-90". In this embodiment, the cleaning operation is executed while the number of the particles suspended by the gases flowing through the vacuum pipe 16A is counted. According to this arrangement, it is possible to know the state of cleaning in real time, thus enabling a proper decision as to the timing of termination of the cleaning operation.

Third Embodiment

Figure 3:
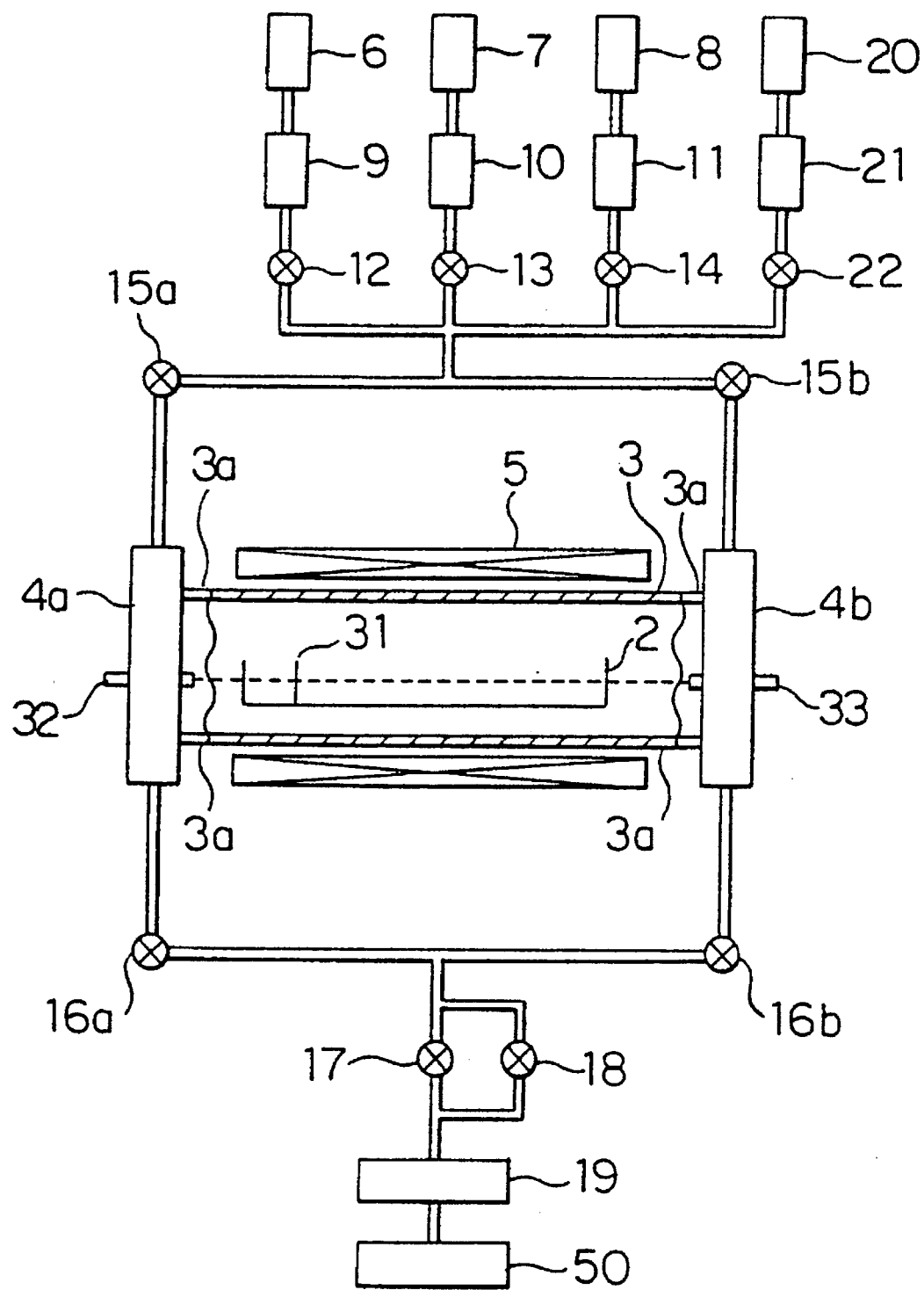
FIG. 3 is a schematic illustration of a horizontal vacuum CVD apparatus as a third embodiment of the present invention.

FIG. 3 is a schematic illustration of a horizontal vacuum CVD apparatus as a third embodiment of the present invention. Referring to the Figure, the quartz boat carries a monitor wafer on which the polycrystalline film has been formed. The vacuum flange 4a is equipped with a laser beam emitting device 32, while the vacuum flange 4b is equipped with a laser beam detector 33. During the cleaning with the $ClF_3$ gas, the laser beam emitted from the laser beam emitting device 32 is transmitted through the monitor wafer 31 so as to be detected by the laser beam detector 33. The laser beam used in this embodiment has such characteristics that the beam passes through the monitor wafer when the latter is clean but cannot pass through the wafer when the latter has contaminants deposited thereon.

In this embodiment, the cleaning operation proceeds while the state of removal of the deposited matter from the monitor wafer 31 is determined in real time, so that the timing of termination of the cleaning operation can be decided properly. It is to be noted, however, that the amount of removal of the deposited matter from the monitor wafer 31 does not always correspond to the amount of removal of this matter from the inner surface of the quartz tube 3. Nevertheless, a suitable calibration table, based on a relationship between these amounts of removal, enables the operator to predict the amount of removal of deposited matter from the inner surface of the quartz tube 3, from the detected amount of removal of the deposited matter from the monitor wafer 31. It is thus possible to exactly determine the timing of termination of the cleaning, thus realizing a desired level of particle removal.

Although deposition or formation of a phosphorus-doped polycrystalline silicon film on a silicon wafer has been specifically mentioned in the foregoing description of the embodiments, it will be clear that the invention can equally be applied to the processes for forming different types of films such as non-doped polycrystalline silicon film, silicon nitride films, an oxide films using TEOS, and so forth. The invention also can be applied to a horizontal plasma CVD apparatus, as well as to a vertical CVD apparatus, although horizontal vacuum CVD apparatuses have been specifically described.

Furthermore, the $ClF_3$ gas used as the fluorine-containing gas in the described embodiments may be replaced with other types of fluorine-containing gases. Namely, the advantages of the invention as described can be achieved also when the $ClF_3$ gas is replaced by, for example, HF gas, $F_2$ gas, $NF_3$ gas, $CF_4$ gas or other gases which produce fluorine radicals.

What is claimed is:

1. A method of cleaning contaminants that react with fluorine from walls of a vacuum CVD apparatus comprising:

providing a reaction chamber that may accommodate a plurality of semiconductor wafers;

placing in the reaction chamber a monitor wafer that transmits a laser light beam and that is covered by a contaminant also disposed on walls of the CVD apparatus, the contaminant not transmitting the laser light beam;

heating the reaction chamber and maintaining a vacuum in the reaction chamber;

shining a laser light beam on the monitor wafer and detecting a laser light beam transmitted through the monitor wafer and the contaminant on the monitor wafer;

introducing into and discharging from the reaction chamber a flow of a fluorine-containing compound gas and a carrier gas while switching the paths of the gases in a flip-flop manner from end to end of the reaction chamber, thereby removing the contaminant from walls of the reaction chamber and from the monitor wafer;

monitoring the laser light beam transmitted through the monitor wafer and contaminant on the monitor wafer; and terminating the flow of the fluorine containing compound gas when the laser light beam transmitted exceeds a threshold.

* * * * *